United States Patent [19]

Schachameyer et al.

[11] Patent Number: 4,670,064
[45] Date of Patent: Jun. 2, 1987

[54] GENERATING HIGH PURITY IONS BY NON-THERMAL EXCIMER LASER PROCESSING

[75] Inventors: Steven R. Schachameyer, Whitefish Bay; James A. Benjamin, Waukesha; John B. Pardee, Milwaukee, all of Wis.; Lyle O. Hoppie, Birmingham, Mich.

[73] Assignee: Eaton Corporation, Cleveland, Ohio

[21] Appl. No.: 721,551

[22] Filed: Apr. 10, 1985

[51] Int. Cl.$^4$ .................. H01L 21/265; B01J 1/10
[52] U.S. Cl. .................... 148/1.5; 29/576 B; 29/576 T; 148/175; 148/187; 148/DIG. 83; 427/38; 427/53.1
[58] Field of Search .............. 148/1.5, 175, 187; 29/576 B, 576 T; 427/53.1, 38

[56] References Cited

U.S. PATENT DOCUMENTS

| 4,088,553 | 5/1978 | Rockwood | 250/527 |
| 4,463,028 | 7/1984 | Laude | 427/53.1 |
| 4,529,617 | 7/1985 | Chevenas-Paule et al. | 427/53.1 |

OTHER PUBLICATIONS

Young et al, Solid St. Technology, 26 (Nov. 1983) p. 183.
Deutsch in "Laser . . . Photochemical Processing . . . Devices" ed. Osgood et al, North-Holland, N.Y. 1982 p. 225.
Deutsch et al Appl. Phys. Letts. 38 (1981) 144.
Andreatta et al Appl. Phys. Letts. 40 (1982) 183.

*Primary Examiner*—Upendra Roy
*Attorney, Agent, or Firm*—Andrus, Sceales, Starke & Sawall

[57] ABSTRACT

A semiconductor ion implantation processing technique is disclosed for implanting high purity, high flux density ions in a semiconductor wafer substrate. A reactant gas is irradiated with excimer pulsed ultraviolet laser radiation at a discrete designated pulsed wavelength corresponding to a discrete designated ionization excitation energy of the gas photochemically breaking bonds of the gas to nonthermally photolytically ionize the gas. The ions are then accelerated by an electric field for subsequent implantation into a surface.

3 Claims, 3 Drawing Figures

WAVELENGTH (nm)
EXCITATION ENERGY (eV)

GENERATING HIGH PURITY IONS BY NON-THERMAL EXCIMER LASER PROCESSING

BACKGROUND AND SUMMARY

The invention provides an ion implantation semiconductor processing technique for implanting high purity ions in a semiconductor wafer substrate.

Known ion implantation methodology typically provides an ion source by bombarding a hot filament target with electrons to sputter-off ions, for example to sputter-off titanium ions from a titanium target. However, in electrically bombarding a target, everything around the target is also bombarded, and the whole processing chamber is subject to such bombardment which in turn generates impurities from the chamber walls and other surfaces therein. Implanters typically incorporate a further processing step to magnetically separate out impurities from the generated ion beam. Due to the bombardment and due to the magnetic separation, the end resultant ion beam is of very low flux density. The purer the ion beam desired, the lower the flux density.

The present invention provides a simple and effective technique for generating a high purity, high flux density ion beam for semiconductor ion implantation.

DETAILED DESCRIPTION

Figure 1:
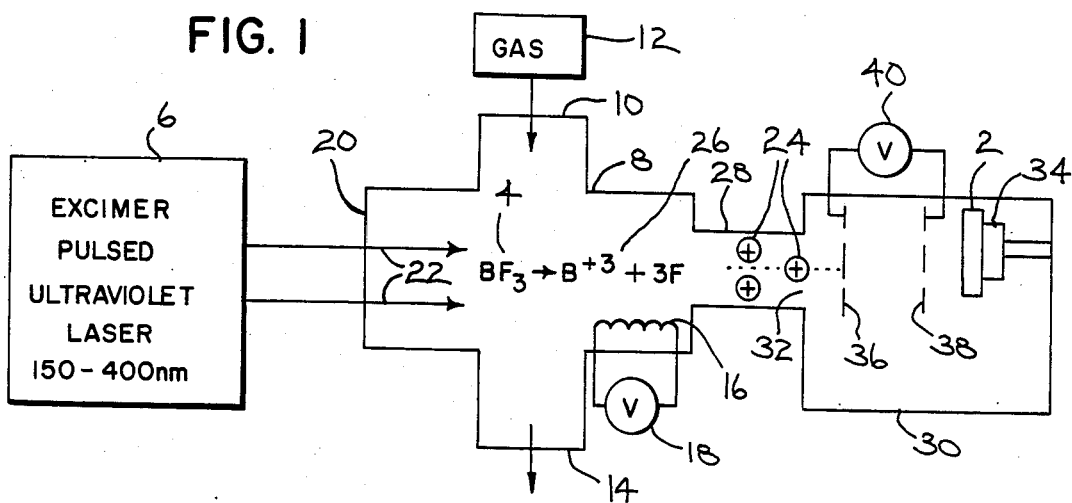
FIG. 1 illustrates the semiconductor ion implantation processing technique in accordance with the invention.

FIG. 1 illustrates a semiconductor ion implantation processing technique for implanting ions in a semiconductor wafer substrate 2. A gas 4 is irradiated with excimer pulsed ultraviolet laser radiation from laser 6 at a discrete designated pulsed wavelength corresponding to a discrete designated excitation energy of the gas photochemically breaking bonds of the gas such that the gas is photolytically ionized, without thermally driven pyrolytic reaction. The ions are then accelerated toward wafer substrate 2.

A conventional processing chamber 8 is provided, having a port 10 for introducing a reactant gas from gas supply 12, which may be exhausted at port 14, as is conventional. Processing chamber 8 typically has a resistance heater coil 16 or the like driven by a voltage source 18 for heating the interior of chamber 8, as is conventional. This thermal processing element is optional in the present methodology. Chamber 8 includes an observation window or port 20.

Figure 3:
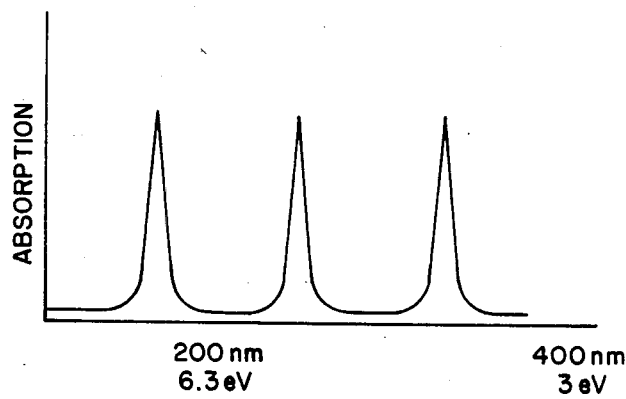
FIG. 3 shows a gas absorption spectrum.
Figure 2:
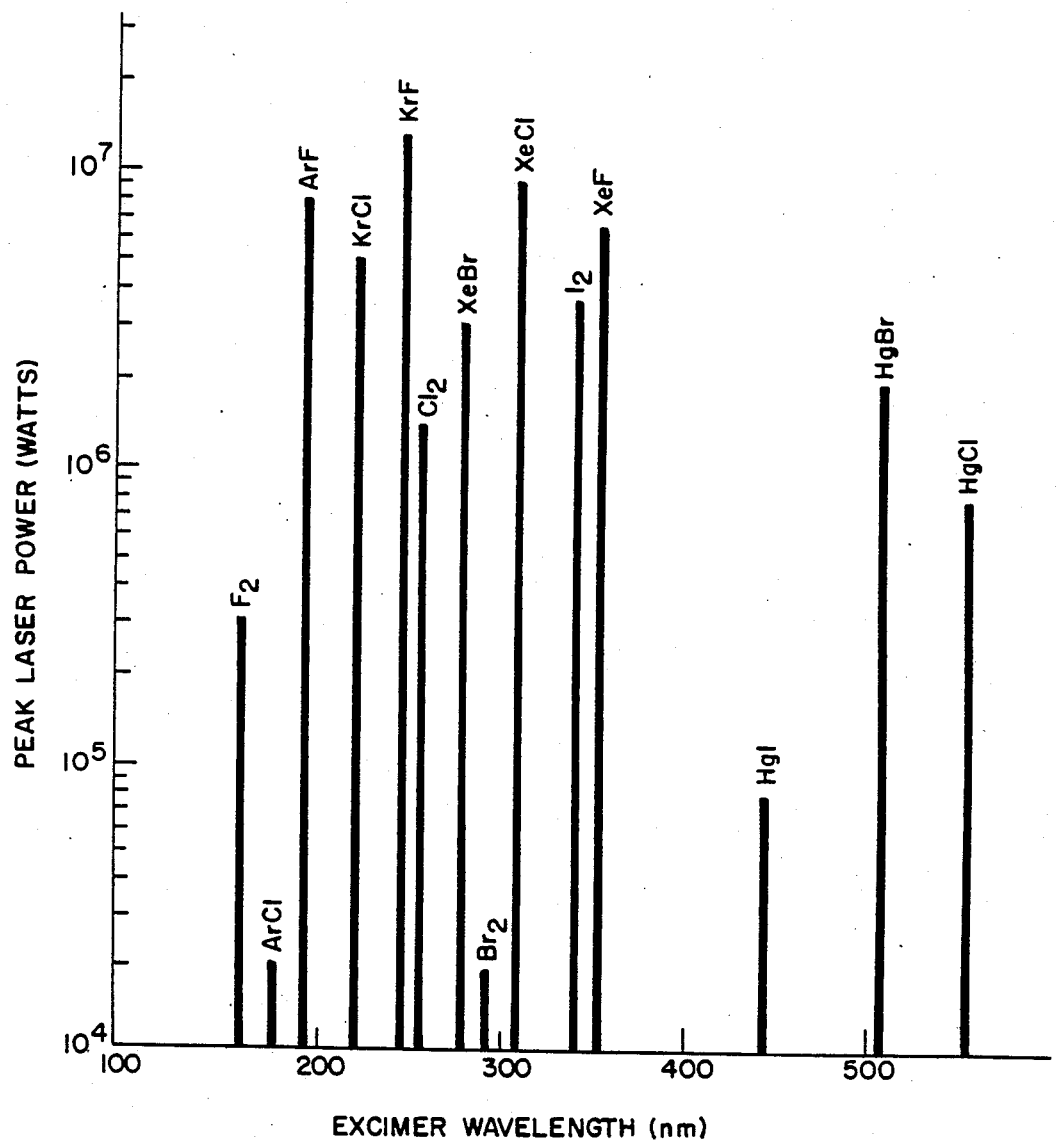
FIG. 2 shows various available excimer pulsed ultraviolet laser radiation wavelengths and peak power.

Excimer pulsed ultraviolet laser radiation from laser 6 is introduced into chamber 8 at 22 through port 20 to photolytically activate and ionize the gas 4 at a temperature ranging from room temperature to about 400° C. FIG. 2 shows various available excimer pulsed ultraviolet laser radiation wavelengths and peak power. FIG. 3 shows an absorption spectrum for a gas including absorption peaks at discrete designated excitation energy wavelengths. At these excitation energy wavelengths, the chemical bonds of the gas molecules are broken in a photolytic reaction. In contrast, a thermally driven pyrolytic reaction breaks gas molecule bonds by thermal agitation and vibration at elevated temperatures typically about 1,000° C. The narrow spectral output of the excimer laser enables specific electronic excitation of reactants, allowing selective breaking of a particular molecule's bonds, driving a predetermined controllable reaction. The laser may be tuned selectively to differentially break bonds of a type of gas molecule from a mixture of gases.

In a particular species, boron trifluoride $BF_3$ is provided from gas supply 12 and an argon fluoride excimer laser at 193 nanometers or a krypton fluoride excimer laser at 248 nanometers is used to photolytically react with the boron trifluoride gas to yield a boron $+3$ ion and three fluorine atoms as shown in FIG. 1. The gas is nonthermally activated and ionized.

The boron $+3$ ions as shown at 24 exit chamber 8 at port 26 and travel through transfer passage 28 to a second processing chamber 30 at entry port 32 to implant semiconductor wafer substrate 2 on supporting pedestal 34 in the chamber. Acceleration means are provided by a pair of spaced apertured grids 36 and 38 and a voltage source 40 for establishing an electrical bias potential thereacross for accelerating ions 24 from the first chamber toward substrate 2 in the second chamber.

It is recognized that various alternatives and modifications are possible within the scope of the appended claims.

We claim:

1. A semiconductor ion implantation processing technique including a method for generating high purity ions for implantation, comprising:
   providing a processing chamber;
   introducing a gas into said chamber;
   providing an excimer pulsed ultraviolet laser and introducing radiation therefrom into said chamber at a discrete designated wavelength to photolytically react with said gas at a discrete designated excitation energy photochemically breaking bonds of said gas to nonthermally activate and ionize said gas, without thermally driven pyrolytic reaction;
   providing a second processing chamber;
   placing a semiconductor wafer substrate in said second chamber; and
   providing a transer passage between said chambers for communicating ions from said first to said second chamber to implant said substrate.

2. The invention according to claim 1, comprising providing acceleration means and accelerating said ions toward said substrate.

3. The invention according to claim 2 comprising providing boron trifluoride said gas and activating said boron trifluoride with said discrete designated pulsed wavelength excimer ultraviolet laser radiation to yield a boron $+3$ ion and three fluorine atoms.

* * * * *